United States Patent [19]

Saaski et al.

[11] Patent Number: 4,833,567
[45] Date of Patent: May 23, 1989

[54] INTEGRAL HEAT PIPE MODULE

[75] Inventors: Elric Saaski, Kirkland, Wash.; Robert J. Hannemann, Wellesley; Leslie R. Fox, Acton, both of Mass.

[73] Assignee: Digital Equipment Corporation, Maynard, Mass.

[21] Appl. No.: 107,890

[22] Filed: Oct. 9, 1987

Related U.S. Application Data

[63] Continuation of Ser. No. 869,505, May 30, 1986.

[51] Int. Cl.$^4$ .............................................. H05K 7/20
[52] U.S. Cl. ................................ 361/385; 165/104.26; 165/104.33
[58] Field of Search ..... 165/185, 104.26 X, 104.33 X, 165/80.3; 357/82; 174/15 HP; 361/382, 385, 386, 388

[56] References Cited

U.S. PATENT DOCUMENTS

| | | | |
|---|---|---|---|
| 3,525,670 | 8/1970 | Brown | 165/104.26 |
| 3,613,778 | 10/1971 | Feldman, Jr. | 361/385 |
| 3,741,292 | 6/1973 | Askalu et al. | 165/105 |
| 3,851,221 | 11/1974 | Beaulieu et al. | 317/100 |
| 4,000,776 | 1/1977 | Kreobig | 165/104.26 |
| 4,047,198 | 9/1977 | Sekhon et al. | 357/82 |
| 4,203,129 | 5/1980 | Oktay | 357/82 |
| 4,212,349 | 7/1980 | Andros et al. | 165/105 |
| 4,233,645 | 11/1980 | Balderes et al. | 361/385 |
| 4,322,737 | 3/1982 | Silwa, Jr. | 357/82 |
| 4,327,399 | 4/1982 | Saaski | 361/385 |
| 4,567,505 | 1/1986 | Pease | 357/82 |

FOREIGN PATENT DOCUMENTS

| | | | |
|---|---|---|---|
| 57-103338 | 6/1982 | Japan . | |
| 58-064055 | 4/1983 | Japan . | |
| 64055 | 4/1983 | Japan | 361/385 |
| 1435110 | 5/1976 | United Kingdom . | |

OTHER PUBLICATIONS

IBM-T.D.B., vol. 13, No. 5, Oct. 1970, Ing, "Self-Cooling Heat Exchanger-Condenser".
IBM-T.D.B., vol. 20, No. 7, Dec. 1977, Krumm, "Chip Cooling".
IBM-T.D.B., vol. 22, No. 3, Aug. 1979, Bakos, Hoffman, Rivenburgh, and Wang, "Programmable Heat Sink Device for Thermal Enhancement".
IBM-T.D.B., vol. 18, No. 3, Aug. 1975.
Silicon Tunnel Heat Sink, Strudwick, IBM Tech. Discl. Bulletin, vol. 23, No. 2, Jul. 1980, p. 579.
Oliver and Feldman, Investigation of Grooved Heate Pipe Evaporators Employing Vapor Release Slots, 1979, American Institute of Aeronautics and Astronautics.

Primary Examiner—G. P. Tolin
Attorney, Agent, or Firm—Nutter, McClennen & Fish

[57] ABSTRACT

An integral heat pipe for transferring heat away from electronic components is disclosed. The heat pipe comprises at least one electronic component mounted to a substrate. A condenser cap is fastened over the substrate to define a sealed pipe chamber around the electronic component. The top of the condenser cap facing the component is a condenser surface and is provided with a number of parallel fluted sections. Each fluted section has parallel vertical sidewalls and a semi-circular top section. A multi-layered fiberous, porous, wick is located between the condenser surface flutes and the top of the electrical component. The top of the component may be provided with a number of parallel grooves exposed to the wick. The pipe chamber is filled with a two-phase working fluid. The heat generated by the electrical component causes the liquid fraction of the working fluid adjacent the component to evaporate. The vapor travels to the fluted condensing surface. The latent heat of vaporization is removed from the vapor so it recondenses and returns to the bottom of the module to repeat the heat transfer cycle. The wick's capillary pumping action keeps the fluid distributed over the top surface of the electronic component. The grooved top surface of the electronic component exposed to the wick cause an inverted liquid meniscus to be formed over the component. This causes the liquid adjacent the top of the component to readily evaporate.

21 Claims, 1 Drawing Sheet

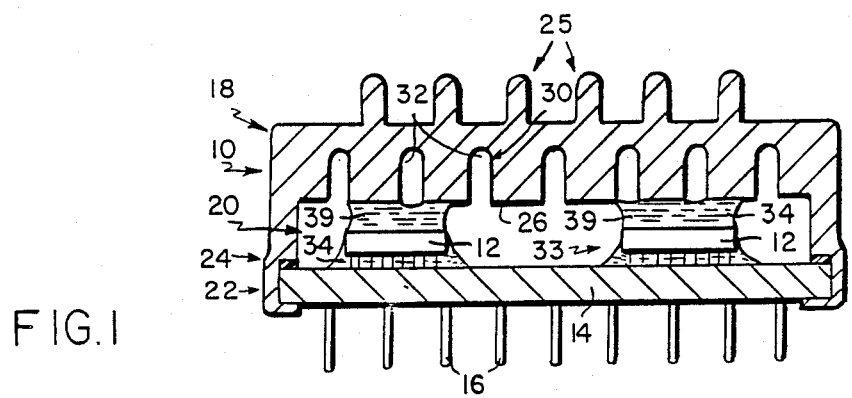
FIG.1
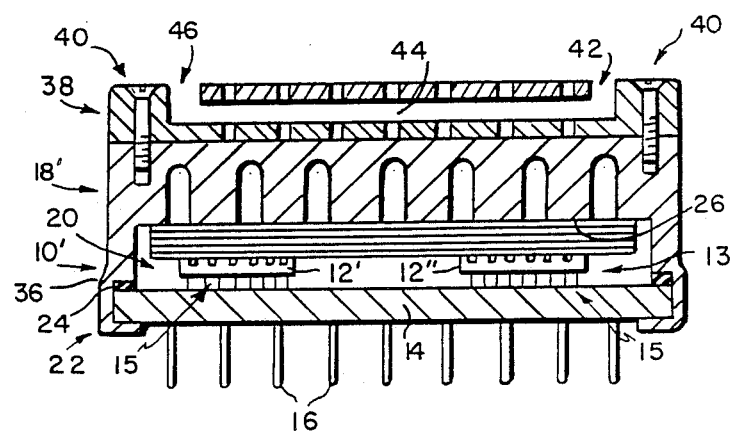
FIG.2
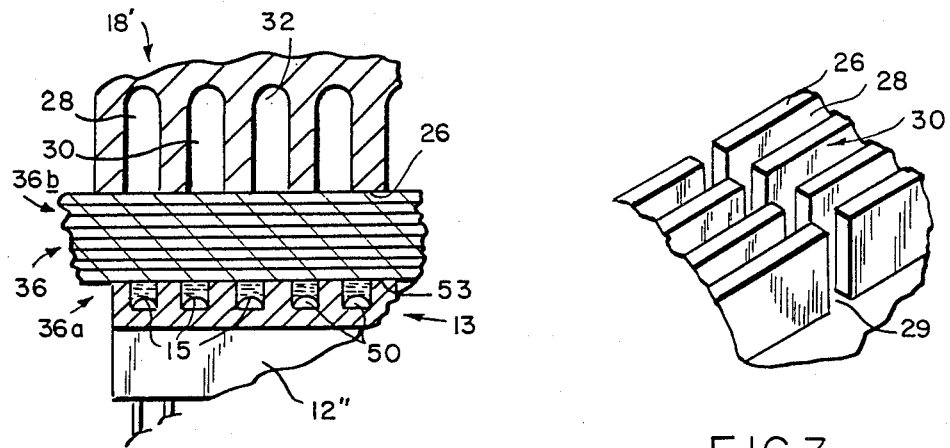
FIG.4
FIG.3

INTEGRAL HEAT PIPE MODULE

This application is a continuation of application Ser. No. 869,505, filed May 30, 1986.

FIELD OF THE INVENTION

This invention relates to a heat pipe for cooling electronic components, and more particularly to an integral heat pipe module for cooling semiconductor chips.

BACKGROUND OF THE INVENTION

Recent advances in semiconductor manufacturing technology have resulted in the increased miniaturization of integrated circuit chips. The new chips are able to perform more complex functions than their predecessors, yet are often of the same size or smaller. In order to perform these complex functions, the new chips consume more power than their predecessors, and as a consequence generate more heat. This is significant because most chips should be operated between 20° C. to 80° C. If a chip becomes too hot, the semiconductor junctions have a tendency to break down and the chip may malfunction. Thus, it is necessary to keep chips operating in a thermally stable environment by cooling them, to insure that they continually function properly.

A number of methods have been suggested and tried to remove the heat generated by chips. Cooling fins large enough to properly disipate the heat generated by a chip would be so large that supplying them would defeat the purpose of having a miniaturized chip. Cooling fans are unsuitable for the same reason. Furthermore, many cooling fans large enough to adequately cool integrated circuit chips weigh more and consume more power that the chips themselves.

There have also been some efforts at providing conduction cooling modules. These modules have a mechanical member with relatively low thermal resistance in contact with the surface of the chip. The mechanical member provides a conductive path to transfer the heat generated by the chip to a heat sink. These modules impose a mechanical stress on the chip because of the physical contact of the mechanical member. This stress is aggravated because the thermal expansion characteristics of the chip and mechanical member are usually significantly different. Also, because each module has a large number of components, they are relatively expensive to manufacture.

Heat pipes have also been used to dissipate heat generated by semiconductor chips. Heat pipes are closed systems having a two-phase working fluid inside a container. The working fluid has a vaporization temperature within the operative temperature range of the chips to be cooled. One end of the heat pipe is exposed to the component to be cooled and the opposite end is exposed to a heat sink. The heat generated by the chip vaporizes the working fluid in the adjacent section of the pipe. The vapor travels to the cooler regions of the pipe. The latent heat of vaporization is then transferred by conduction to the heat sink, and the vapor condenses. The condensed liquid is transferred back to the end of the pipe adjacent to the component to repeat the cycle.

"Two types of heat pipes have been used to cool semiconductor chips. External heat pipes are located adjacent to the external packages of a number of electronic components. These external heat pipes are characterized by relatively high thermal resistance between the chips external packages and the thermal input ends of the heat pipes. Thus, external heat pipes are not particularly efficient at transferring heat away from chips. Also, external heat pipes are relatively large, and are not space efficient to use for cooling a small number of chips."

The integral heat pipe is the other type of heat pipe. It is built into the electronic component package, or module. One or more chips are directly exposed to the working fluid. In many of these heat pipes the chips are located in the bottom of a liquid pool. The heat is transferred from the chips to the fluid by nucleate boiling. If the heat flux from a chip becomes too great, a vapor bubble may form around the chip. The bubble forms an insulating layer that effectively stops further evaporation and heat transfer. Some integral heat pipes require a wick inside the module. Often the wick is a glass fiber or dielectric powder that is affixed to the chips and the interior of the module. These wicks may place a mechanical stress on the chips. Also, inserting the wick inside the module adds significantly to the cost of manufacturing the heat pipe.

A need therefore exists for a new apparatus for removing the heat generated by integrated circuit semiconductor chips. The new apparatus should be able to efficiently transfer the heat away from the chips so the chips will remain within the range of their operating temperature. Furthermore, it should be able to transfer heat way from the chips regardless of their heat flux. The new apparatus should also be small so that its use will not defeat the advantage of miniaturized components. Also, it should not rely on an external source of power, should not subject the chip to undue mechanical stress, and should be relatively economical to produce.

SUMMARY OF THE INVENTION

This invention comprises an integral heat pipe module where the semiconductor chips are mounted on a substrate and the substrate functions as the base or input end of the heat pipe module. A condenser cap is attached to the substrate to form a sealed pipe chamber around the chips. The top of the cap, opposite the substrate, is provided with a fluted condenser surface. A multi-layer fibrous wick may be located between tops of the chips and the bottom of the condenser surface. The tops of the chips may be provided with a grooved surface in contact with the wick. The pipe chamber is supplied with a neutral two-phase working fluid and sealed. The top of the module or output can be provided with an appropriate heat sink.

The working fluid is split into vapor phase and liquid phase fractions. The liquid portion is on, or adjacent to, the chips as a relatively thin film, or contained within the wick. When the module is in operation and the chips generate heat, the heat produced by the chips evaporates the thin film of liquid adjacent the chips. The vapor moves to the fluted condenser surfaces at the top of module. The heat sink extracts the latent heat of vaporization, causing the vapor to condense. The recondensed liquid returns to the base of the heat pipe to repeat the cooling cycle.

There are several advantages to this heat pipe. The fluted condenser surface at the top of the heat pipe has sufficient surface area to conduct large quantities of latent heat away from the vapor per unit of time. This makes the module very efficient at transferring heat away from the chips. Since there is only a thin film of liquid in contact with the chips the liquid evaporates readily. Also, there is almost no possibility that a vapor bubble will form over the chips, inhibiting the heat transfer characteristics of the module, yet the stress the wick places on the chip is minimal. When the grooved chip is provided with a grooved top surface an inverted meniscus forms between the liquid in the wick and the chip. The meniscus enhances the evaporation efficiency of the chip, increasing the overall heat transfer characteristics of the heat pipe module.

Also, the heat pipe module is relatively small and can be designed for use with just one or two chips. The module does not have any moving parts and does not require any external power. Furthermore, only a few parts are needed to assemble this heat pipe module, and even with the wick, it is relatively economical to produce.

BRIEF DESCRIPTION OF THE DRAWINGS

FIG. 1 is a cross-section view illustrating a first embodiment of the heat pipe of this invention.

FIG. 2 is a cross-section view illustrating a second embodiment of the heat pipe of this invention.

FIG. 3 is a plan view of a portion of the condenser surface of the heat pipe of this invention.

FIG. 4 is an enlarged view of the flutes, wick, and grooved chip of this invention.

DETAILED DESCRIPTION OF THE PREFERRED EMBODIMENTS

As illustrated in FIG. 1 an integral heat pipe module 10 is provided with one or more electrical components, here semiconductor chips 12, bonded to a substrate 14. The substrate is provided with a number of external leads 16 so the module can be connected to the electrical unit for which it was designed. A condenser cap 18 is fastened over the substrate and defines a chamber 20 around the chips. The condenser cap has a lip 22 that extends around the perimeter of the substrate for securing it to the substrate. A sealing ring 24 is located between the top perimeter of the substrate and the cap lip to provide a hermetic seal around the pipe chamber. The top of the condenser cap is provided with a number of cooling fins 25.

A condenser surface 26 is located under the condenser cap 18 opposite the chips 12. The condenser surface is provided with a number of parallel flutes 28 that extend the length of the cap. Each flute has vertically oriented sidewalls 30 and a top 32 with a semicircular cross-section. There is a small gap, e.g., approximately 0.2 to 1.0 mm, between the the condenser surface 26 and the tops of the chips 12. As shown in FIG. 3, the condenser cap may also be provided with cross cuts 29 extending across the condenser surface, perpendicular to the flutes 28 and thereby interconnecting the flutes.

Prior to sealing of the heat pipe module 10, a two-phase working fluid 33 is injected into the chamber 20. The ideal fluid is one that is chemically compatible with the module components inside the chamber, relatively non-toxic, a dielectric, and has a boiling point within the operative temperature range of the chips. In its liquid phase the working fluid should have a low viscosity and a high surface tension. Pentane is a relatively ideal working fluid for many applications.

The chamber 20 should be filled to approximately 50% of its volume with liquid working fluid. For a chamber 20 having dimensions of 5.1 cm×5.1 cm×0.3 cm, approximately 1 cc of working fluid was used. The fluid should be pressurized so there is a liquid fraction 34 of fluid is located in the bottom of the chamber, around or over the chips, and a vapor fraction in a space 35 above the liquid fraction. For pentane the fluid should be at approximately one atmospheric pressure. A thin film 39 of the liquid fraction of the working fluid covers the chips by virtue of the capillary binding action between the chips 12 and the condenser surface 26.

The integral heat pipe module 10 functions when the chips generate heat. The thin film 39 of liquid workig fluid 34 is in direct contact with the chip and absorbs the heat generated by them. Heat is transferred away from the chips by thin film evaporation of the liquid. The vapor travels towards the condenser surface 26, carrying with it the latent heat of evaporation. The condenser surface conducts the latent heat away from the vapor towards the cooling fins 25.

The flutes 28 provide the condenser surface 26 with sufficient area so a large quantity of latent heat may be conducted away from the vapor at any one time. The vapor condenses and the liquid returns to the bottom of the chamber so the cycle can repeat. The cross cuts 29 provide a way for the liquid and vapor to flow between the flutes. This keeps the vapor dispersed throughout the flutes so that the liquid condenses out over the whole of the condenser surface. This also alleviates flooding of the low portion of the module if the module 10 is tilted from horizontal.

The integral heat pipe module 10' depicted in FIG. 2 is provided with additional features. A multi-layered fibrous wick 36 is located between and in contact with the tops of the chips 12', 12" and the bottom of the condenser surface 26. The wick is formed of multiple layers of polyester woven fabric 36a–h, as FIG. 4 illustrates, the layer 36a in contact with the chip 12' 12" is 421 mesh (421 strands per inch); the intermediate layers 36b–g are 302.4 mesh, and the layer 36h in contact with the condenser surface 26 is 208 mesh.

The top surface of the chip 12' is provided with parallel micro grooves 15. The micro grooves extend across the chip and have a pitch density of approximately 60 grooves/cm. Alternatively, as shown in FIG. 4, a chip 12" may be provided with a grooved evaporator cap 13. The evaporator cap eliminates the possibility that the chip 12" will be damaged during a grooving process. If an evaporator cap is provided, it should be formed of the same material as the chip to avoid stresses caused by the differential thermal expansion. The cap should be attached with an adhesive having a relatively low thermal resistance.

Referring again to FIG. 2, a cold plate 38 is attached to the top of the condenser cap 18' by screws 40. The cooling plate has an inlet 42, a cooling chamber 44, and an outlet 46. This allows a cooling fluid, such as water to be circulated through the cold plate.

In this embodiment of the invention the wick 36 insures that the tops of the chips are always in contact with a liquid fraction of the working fluid. Specifically, the separate layers of the wick are pressed together to form a single porous structure. The capillary pumping action of the wick keeps the entire wick saturated with liquid and this keeps the top of the chips exposed to a thin film 53 depicted in FIG. 4, of liquid working fluid that readily evaporates. Since the wick is formed of pliant, flexible material, the stress it exerts on the chips is minimal. The wick's pumping action is an important advantage when the module is operated at a tilt from the horizontal. In such instances the capillary pumping action of the wick prevents the working fluid from migrating to the lowest part in the module where it would otherwise collect.

When the wick is used, the grooved top surfaces of the chips enhance the heat transfer efficiency of the evaporation process. An inverted meniscus 50 of the liquid working fluid forms between the wick and the grooved top surface. The liquid-vapor shear of the meniscus increases the turbulence in the liquid and forms a thin film of liquid around the grooves. This causes the working fluid to evaporate readily. Also, the centers of the grooves are liquid-free and provide a path for the saturated vapor to travel to the condenser surface 26. This reduces the vapor content of the space adjacent to the liquid-vapor interface so as to induce additional evaporation into the space. The cold plate 38 acts as the heat sink for the latent heat of vaporization transferred by the working fluid.

The heat pipe 10 can be economically manufactured. For many applications the module has sufficient heat transfer properties without the wick. The wick is formed of an inexpensive fiber and can be provided without appreciably increasing the cost of the module. Providing the chips with grooved top surfaces is recommended only if the chip's heat flux is relatively high, e.g., 16W/cm$^2$ or greater. Also, the heat pipe module is small enough so that it can be designed for use with just one or two components. Furthermore, since transfer of heat from the chips is by thin film evaporation, there is almost no possibility that an excessive chip heat flux will cause a vapor bubble to form around a chip that would inhibit the heat transfer process.

What is claimed as new and desired to be secured by Letters Patent of the United Sttes is:

1. An integral heat pipe module for electronic components having at least one component mounted to a substrate, the component having a top surface spaced away from the surface of the substrate, said module comprising:
   a. a condenser cap sealingly attached to the substrate over the electronic component so as to define a sealed chamber around the electronic component;
   b. a condenser surface under the top of said condenser cap having a surface spaced a selected distance away from the top surface of the electrical component so a continuous thin film of liquid is maintained therebetween, said condenser cap having a plurality of flued sections that extend upward from said surface across the condenser cap; and
   c. a sufficient volume of a two-phase, noncorrosive dielectric working fluid having a low-viscosity, high surface tension liquid fraction retained inside said chamber so as to maintain a thin film of liquid working fluid that extends continuously between the top surface of the electronic component and said condenser surface; said fluted sections of said cap being substantially free of said liquid fraction of working fluid, so that heat transfer by said working fluid from the component is substantially by thin film evaporation.

2. The integral heat pipe module of claim 1 wherein the flues are separated by vertical side walls, and the bottom of the side walls forming said condenser surface spaced from the electronic component.

3. The integral heat pipe module of claim 1 wherein each of the flutes has a top section with semicircular cross-section.

4. The integral heat pipe module of claim 1 wherein the flutes are connected together by at least one cross flute.

5. The integral heat pipe of claim 1 wherein the condenser cap is connected to a heat sink.

6. The integral heat pipe of claim 5 wherein thcondenser cap is provided with at least one external cooling fin, whereby said cooling fin serves as a heat sink.

7. The integral heat pipe of claim 5 wherein the condensor cap is connected to a heat sink by securing a cold plate to the top of the condensor cap.

8. An integral heat pipe module for electronic components having at least one component mounted to a substrate, the component having a top surface spaced away from the surface of the substrate, said module comprising:
   a. a condenser cap sealingly attached to the substrate over the electronic component so as to define a sealed chamber around the electronic component;
   b. a condenser surface under the top of said condenser cap spaced away from the top surface of the electrical component, so as to define a space therebetween, said surface having a plurality of fluted sections that extend across the condenser surface;
   c. a porous wick of sufficient thickness in said chamber between the top of the electrical component and said condenser surface so as to substantially fill the space therebetween; and
   d. a sufficient volume of a two-phase, noncorrosive, dielectric working fluid having a low-viscosity, high surface tension liquid fraction retained inside said chamber so said porous wick is saturated with the liquid fraction of working fluid so as to maintain a thin film of liquid working fluid within said porous wick that extends continuously between the top surface of the electronic component and the condenser surface.

9. The integral heat pipe module of claim 8 wherein the flutes are separated by vertical side walls, and the bottom of the side walls form the condenser surface spaced from the electronic component.

10. The integral heat pipe module of claim 8 wherein each of the flutes has a top section with semicircular cross-section.

11. The integral heat pipe module of claim 8 wherein the flutes are connected together by at least one cross flute.

12. The integral heat pipe of claim 8 wherein an evaporator cap having a grooved top surface is attached to the top of the electronic component, and the top of said grooved top surface is in contact with said wick.

13. The integral heat pipe of claim 8 wherein the condenser cap is connected to a heat sink.

14. The integral heat pipe of claim 13 wherein the condenser cap is provided with at least one external cooling fin, whereby said cooling fin serves as a heat sink.

15. The integral heat pipe of claim 13 wherein the condenser cap is connected to a heat sink by securing a cold plate to the top of the condenser cap.

16. The internal heat pipe of claim 8 wherein the wick is composed of multiple layers of fibrous material.

17. The integral heat pipe of claim 8 wherein the wick is formed of a plurality of layers of polyester cloth.

18. The integral heat pipe of claim 16 wherein the wick is composed of woven fibrouus material and the layer in contact with the electronic component has a greater mesh than the layers spaced away from the electronic component.

19. The integral heat pipe of claim 16 wherein the wick is composed of woven fibrous material and the layer in contact with the condenser surface flutes has a coarse mesh than the layers spaced away from the condenser surface flutes.

20. The integral heat pipe of claim 8 wherein the electronic component is provided with a grooved top surface in contact with the wick.

21. The integral heat pipe of claim 12 wherein the electronic component and the evaporator cap are formed of essentially the same material.

* * * * *